United States Patent [19]
Kianush et al.

[11] Patent Number: 6,094,568
[45] Date of Patent: Jul. 25, 2000

[54] RADIO RECEIVER FOR RECEIVING A MAIN RADIO BROADCAST SIGNAL AND A MONOLYTHIC INTEGRATED CIRCUIT FOR USE IN SUCH RADIO RECEIVER

[75] Inventors: Kaveh Kianush, Eindhoven, Netherlands; Udo F. Schillhof, Itzstedt, Germany; Cicero S. Vaucher, Eindhoven, Netherlands

[73] Assignee: U. S. Philips Corporation, New York, N.Y.

[21] Appl. No.: 08/959,220

[22] Filed: Oct. 28, 1997

[30] Foreign Application Priority Data

Nov. 6, 1996 [EP] European Pat. Off. .............. 96203089

[51] Int. Cl.[7] ................................. H04B 1/18; H04B 1/16
[52] U.S. Cl. ..................................... 455/161.1; 455/161.1; 455/161.3; 455/186.1; 455/186.5
[58] Field of Search .......................... 455/186.1, 185.1, 455/184.1, 161.3, 186.5, 150.1, 151.1, 152.1, 161.1, 162.1, 166.1, 166.2

[56] References Cited

U.S. PATENT DOCUMENTS

| 5,220,682 | 6/1993 | Tomohiro | 455/161.1 |
|---|---|---|---|
| 5,349,699 | 9/1994 | Erben et al. | 455/186.1 |
| 5,428,825 | 6/1995 | Tomohiro et al. | 455/186.1 |
| 5,428,827 | 6/1995 | Kasser | 455/161.3 |
| 5,471,662 | 11/1995 | Shiota | 455/166.1 |
| 5,548,828 | 8/1996 | Kozaki et al. | 455/161.2 |
| 5,745,845 | 4/1998 | Suenaga et al. | 455/194.1 |

FOREIGN PATENT DOCUMENTS

0403744A2  12/1990  European Pat. Off. ......... H04H 1/00

Primary Examiner—Daniel S. Hunter
Assistant Examiner—Meless Zewdu
Attorney, Agent, or Firm—Edward W. Goodman

[57] ABSTRACT

An RDS or RDBS radio broadcast receiver, utilizing a microcontroller and a serial communication bus, receives a list of alternative frequencies to allow the receiver to switch to an alternative frequency when the quality of the main radio broadcast signal deteriorates. Therefore the quality of the alternative frequency transmissions has to be updated from time to time. To avoid time delays caused by the relatively slow serial communication bus, the tuning section includes further controller for performing the alternative frequency updates.

4 Claims, 3 Drawing Sheets

RADIO RECEIVER FOR RECEIVING A MAIN RADIO BROADCAST SIGNAL AND A MONOLYTHIC INTEGRATED CIRCUIT FOR USE IN SUCH RADIO RECEIVER

BACKGROUND OF THE INVENTION

1. Field of the Invention

This invention relates to a radio receiver for receiving a main radio broadcast signal having a particular transmission frequency and comprising a data signal containing information on one or more alternative frequencies to which the receiver may be tuned in case the quality of the main radio broadcast signal drops below predetermined standards, said receiver having a tuning section for selecting, amplifying and demodulating the main radio broadcast signal, a data signal demodulator for extracting and demodulating the data signal contained therein and, a microcontroller for extracting alternative-frequency information from the demodulated data signal and for communicating such alternative frequency information, through a serial communication bus to storage means of the tuning section.

2. Description of the Related Art

Receivers of this kind are, for instance, known from Application Note 96010 entitled: "User Manual of High End RDS/EON Car Radio System CCR525(V1.4)" and published by Philips Electronics Semiconductor Division. Herein, "RDS" stands for "Radio Data System", a digital data transmission system, which is transmitted simultaneously with radio broadcast signals and which gives to the receiver useful information on the radio broadcast transmission. RDS is nowadays widely used in European countries and more particulars thereof may be found in the "Specification of the radio data system RDS for VHF/FM sound broadcasting" Ref. nr. prEN 50067:1992 E, issued by CENELEC, which has been herein incorporated by reference. In the United States, a similar system, mentioned RDBS, is adopted, for which reference is made to the "Specification of the radio broadcast system RBDS" issued by NRSC on January, 1993.

One major service provided by RDS is the transmission of alternative frequency information, which is transmitted in the "alternative frequency list" of the RDS-signal of the main radio broadcast signal. This service gives the possibility to automatically switch the receiver to an alternative frequency transmission having the same program when the signal-quality of the main radio broadcast signal deteriorates. To properly carry out this function, the receiver must continuously monitor the quality of the alternative frequency transmissions. The quality check can, e.g., be a combination of measurements on RF-level, adjacent channel interference, multipath distortion, value of intermediate frequency, etc. Some quality measurements, such as on the RF level, can be done in a fraction of a millisecond, whereas others, for example, on multipath distortion, may require a few milliseconds for a stable result. These quality checks are carried out with the audio output muted to avoid aggressive audio plops and breakthroughs. But muting the signal leaves an audio gap which can also be annoying, especially if the gaps are at regular intervals.

To make the audio gap less annoying, most high-end receivers utilize a pause detector to update the quality record of the alternative frequency transmissions only in the quiet passages. This, however, limits the updating speed and may not be permitted when the signal conditions suddenly deteriorate.

One other possibility is to reduce the muting periods until the audio gaps in speech or music can no longer be perceived. Studies carried out on the audibility of such gaps have shown that gaps of up to 5 ms with gentle slopes of 1 ms are almost completely inaudible whereas gaps larger than 10 ms are in all cases completely audible. The problem with reducing the audio gaps to below 5 ms, with conventional tuning systems and updating algorithms, is that the quality measurement period would become very short. A typical RDS update requires about 1 ms for communicating the alternative frequency from the microprocessor through the serial communication bus to the tuning section, at least 1 ms for the fastest available phase-locked loop (PLL) to jump to the alternative frequency, at least 3 ms for the quality measurements, again 1 ms to communicate the original tuning frequency to the PLL and another 1 ms for the PLL to jump back to this original frequency, resulting in an audio gap of more than 7 ms.

SUMMARY OF THE INVENTION

The present invention provides a solution for shortening the RDS update cycle and the radio broadcast receiver according to the invention is therefore characterized in that the tuning section comprises further controlling means for temporarily tuning the tuning section to an alternative radio broadcast signal for establishing the quality of the alternative radio broadcast signal, thereby utilizing the alternative frequency information contained in said storage means. This measure ensures that the periods, during which the alternative frequency information is transmitted through the serial bus, lie outside the actual muting periods of the audio signal, so that these muting periods can be made shorter. The further controlling means may be constituted by a simple local hardware controller in the tuning section, with all the necessary algorithms for RDS-updating.

A first embodiment of a radio receiver according to the invention is characterized in that the storage means is suitable to store both the alternative frequency information and the frequency information of the main radio broadcast signal and in that said further controlling means is arranged to use the content of the storage means to re-tune the tuning section to the main radio broadcast signal when the temporary tuning to the alternative radio broadcast signal ends. After initiating an updating procedure via the serial communication bus, the further controlling means, with the frequency information contained in the storage means, will then carry out the tuning tasks without any interaction with the external microcontroller. The RDS-updating is therefore markedly faster compared to the prior art algorithms which are carried out completely by the microcontroller.

To minimize the content of storage means, and therefore the chip-area, needed for the RDS-updating, a second embodiment of a radio receiver according to the invention is characterized in that said storage means receives frequency information of the main radio broadcast signal from the microcontroller through the serial communication bus during the time that the tuning section is temporarily tuned to the alternative radio broadcast signal, said further controlling means being arranged to use the content of said storage means to re-tune the tuning section to the main radio broadcast signal when the temporary tuning to the alternative radio broadcast signal ends. In this embodiment, when the alternative frequency information is loaded in said storage means, the frequency information of the main radio broadcast signal is lost. However during the quality check of the alternative frequency transmission, this latter frequency information is reloaded in the storage means, so that this frequency information is again available in the tuning device to re-tune the receiver to the main radio broadcast transmission.

On the other hand, when the cost of the storage means plays only a minor role in the total cost price of the receiver, the storage means in the tuning device may be sufficiently large to store the alternative frequency information of, for instance, the complete alternative frequency list which is provided in the RDS-signal of the main radio broadcast transmission. In that case, the process of updating the quality check of the whole list of alternative frequencies may be done in the tuning device substantially without involvement of the microcontroller and the serial communication bus.

In all cases, it is necessary for the microcontroller to indicate, to the controlling means of the tuning device, which frequency information, transmitted through the serial communication bus, relates to the main radio broadcast signal, and which frequency relates to an alternative frequency. Therefore a radio receiver according to the invention may preferably be characterized in that the microcontroller sends the alternative frequency information and the frequency information of the main radio broadcast signal to the tuning section in a plurality of bytes, whereby one of the bits in the plurality of bytes indicates whether the information is alternative frequency information or frequency information of the main radio broadcast signal. This solution makes it possible for the tuning device to distinguish between the two types of frequency information with a minimum of transmission time in the serial communication bus and also a minimum of required hardware in the tuning device.

The invention also relates to a monolythic integrated circuit for use in a radio receiver according to the invention, this monolythic integrated circuit comprising means for connecting, through a serial communication bus, a microcontroller, and comprising a further controller for controlling the update of alternative frequency transmissions of said radio receiver.

BRIEF DESCRIPTION OF THE DRAWINGS

These and other aspects of the invention will be described with reference to the attached figures and tables. Herein.

DESCRIPTION OF THE PREFERRED EMBODIMENT

Figure 1:
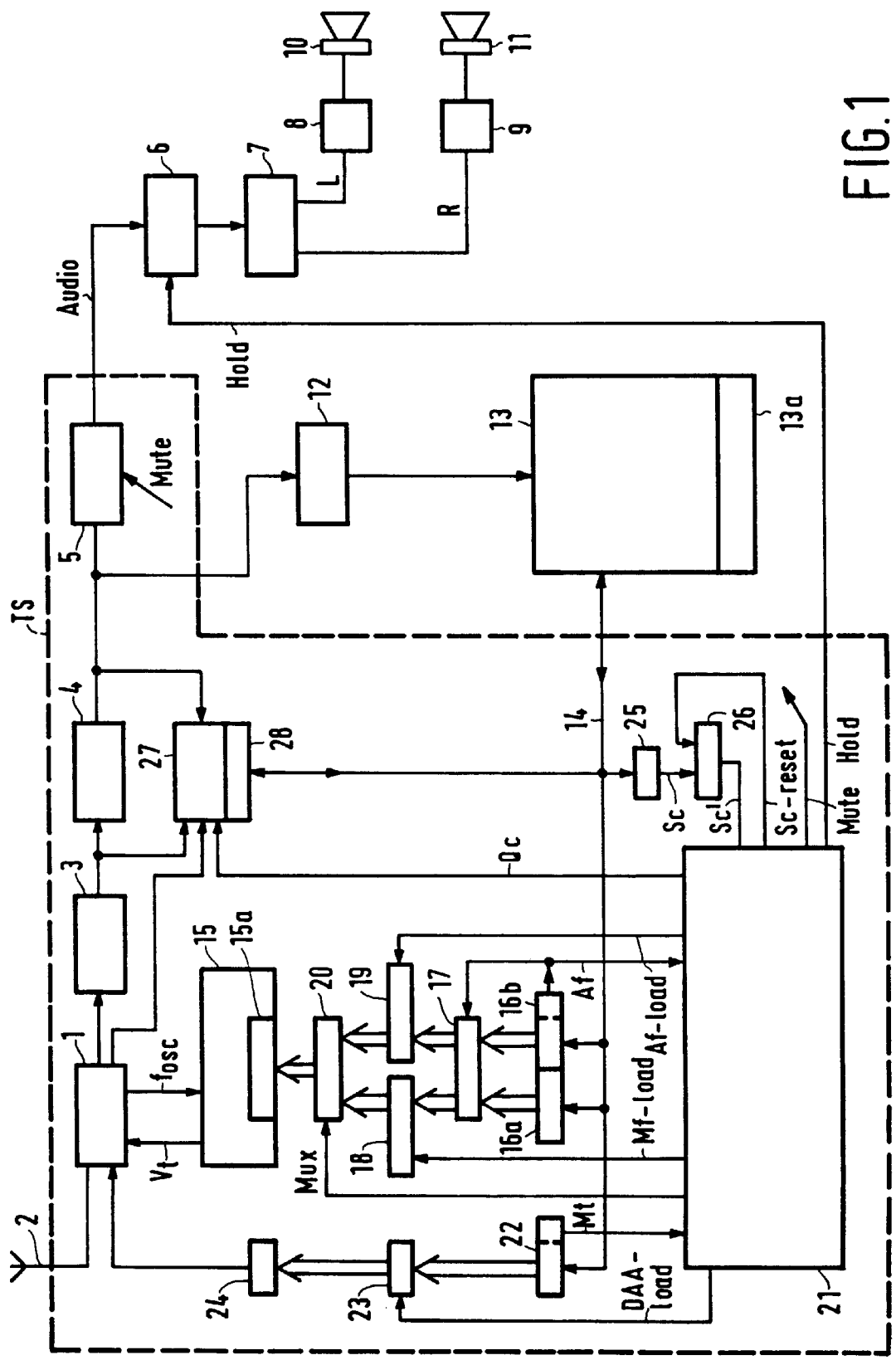
FIG. 1 shows a block diagram of a receiver according to the invention.

The receiver shown in FIG. 1 comprises a front end 1 which can be selectively tuned to radio broadcast signals received by an aerial 2, and which converts the selected radio broadcast signal to an intermediate frequency signal (IF). This IF-signal is applied to an IF-amplifier 3 and demodulated in an FM-demodulator 4. The demodulated signal, usually referred to as the "stereo multiplex signal", is applied, through a muting stage 5 and an audio processor 6, to a stereo decoder 7, where the stereo multiplex signal is split in left and right audio signals. The left (L) and right (R) audio signals are applied to left and right audio amplifiers 8 and 9 for energizing left and right loudspeakers 10 and 11, respectively. It will be apparent that in many cases, such as in case of car radio receivers, the aerial 2 and the loudspeakers 10 and 11 do not form part of the receiver as sold but have to be connected thereto by the user.

The stereo multiplex signal from the FM-demodulator 4 is applied to an RDS-demodulator 12 for demodulating the RDS data signal which is contained in the stereo multiplex signal. The demodulated RDS signal is subsequently applied to a microcontroller 13 with accompanying memory 13a for extracting and storing the data transmitted in the RDS signal. A serial communication bus 14 connects the microcontroller 13 to other parts of the receiver, whereby the microcontroller plays a central controlling role in the receiver. To simplify FIG. 1, some parts, such as e.g., a keyboard and display means, are not shown. The serial communication bus 14 may preferably be according to the I²C-bus protocol, developed by Philips Electronics and particulars of which may be found in the Handbook IC12, issued by Philips Electronics Semiconductor Division.

The front end 1 is tuned to a desired frequency by means of a phase-locked loop (PLL) 15 which receives the oscillator frequency $f_{osc}$ from the front end and sends a tuning voltage $V_t$ to the front end in a usual way. It may be noted that the invention is not at all restricted to the use of a PLL, but other electronic tuning architectures, such as a frequency-locked loop (FLL) or a voltage synthesizer may be used instead. The PLL 15 contains a programmable frequency divider 15a, which is programmed with frequency information that is obtained from the microcontroller 13. This frequency information is transferred via the I²C bus 14 to a frequency latch 16a/16b. Under the control of a register selector 17, the frequency information in the latch 16a/16b is loaded into either a main frequency register 18 or an alternative frequency register 19, and the contents of one of these registers is used to program the frequency divider 15a through a multiplexer 20. The multiplexer 20 and the two frequency registers 18 and 19 are controlled by signals Mux, Mf-load and Af-load, respectively, which are generated by a controller 21 whose operation will be explained afterwards.

The frequency information, which is send to the frequency divider 15a to tune the PLL, is a 15-bit word. The 7 most significant bits are obtained from 8-bit latch 16a and the 8 less significant bits are obtained from 8-bit latch 16b. The first bit (the Af-bit) in latch 16a conveys information as to whether the frequency information relates to an alternative frequency on which an update operation has to be carried out (Af=1) or to a main frequency which is transferred by the microcontroller for standard purposes (Af=0). Depending on the logic value of this Af-bit, the 15-bit frequency word in bus-latches 16a/16b is routed by the register-selector 17 to either the main frequency register 18 (when Af=0) or to the alternative frequency register 19 (when Af=1). These two registers serve as a local RAM-memory for these frequency in formations and provide these in formations via multiplexer 20 to the PLL without any further communication from the microcontroller 13.

Apart from the two frequency information bytes received by bus-latches 16a/16b, a third bus-latch 22 receives a third byte from the microcontroller 13. The bits 2 to 8 thereof serve to correctly tune the preselection filter of front end 1 so that this filter tracks correctly with the oscillator frequency to produce the desired intermediate frequency. The preselection filter has to be tuned to a frequency which is, for example, 10.7 Mhz (=IF) below the oscillator frequency. Bits 2 to 8 of bus-latch 22 are stored in a 7-bit DAA (=digital antenna alignment) register 23 and converted in a DAC (digital-to-analog converter) 24 to generate a tuning voltage for the preselection filter of the front end, to provide tracking with the oscillator frequency. The first bit of bus-latch 22 is a muting bit (Mt) which is send to the controller 21 and whose function will be explained afterwards.

Furthermore, the I²C bus is connected to an Sc-detector 25. When the microcontroller has sent all the relevant information for a particular task, it sends a predetermined Sc-(stop condition)-bit through the bus. The Sc-detector detects when this bit is received and releases an Sc-pulse which sets a flip-flop 26, thereby making an input Sc' of the controller 21 high. A signal Sc-reset resets flip-flop 26 after some time determined by the controller 21.

The blocks 1, 3, 4, 5 and the blocks 15 to 25 described so far, are contained in the receiver's tuning section TS, which is indicated in FIG. 1 by a dashed line. This tuning section further comprises a quality detector 27 which may receive RF-signal from front end 1, IF-signal from IF amplifier 3 andor FM-stereo-multiplex signal from FM-detector 4. The quality detector carries out measurements on one or more of these signals in a manner which is state of the art. The quality values obtained thereby are digitized and stored in quality latches 28 for subsequent transmission through the I²C bus to the microcontroller 13.

Figure 2:
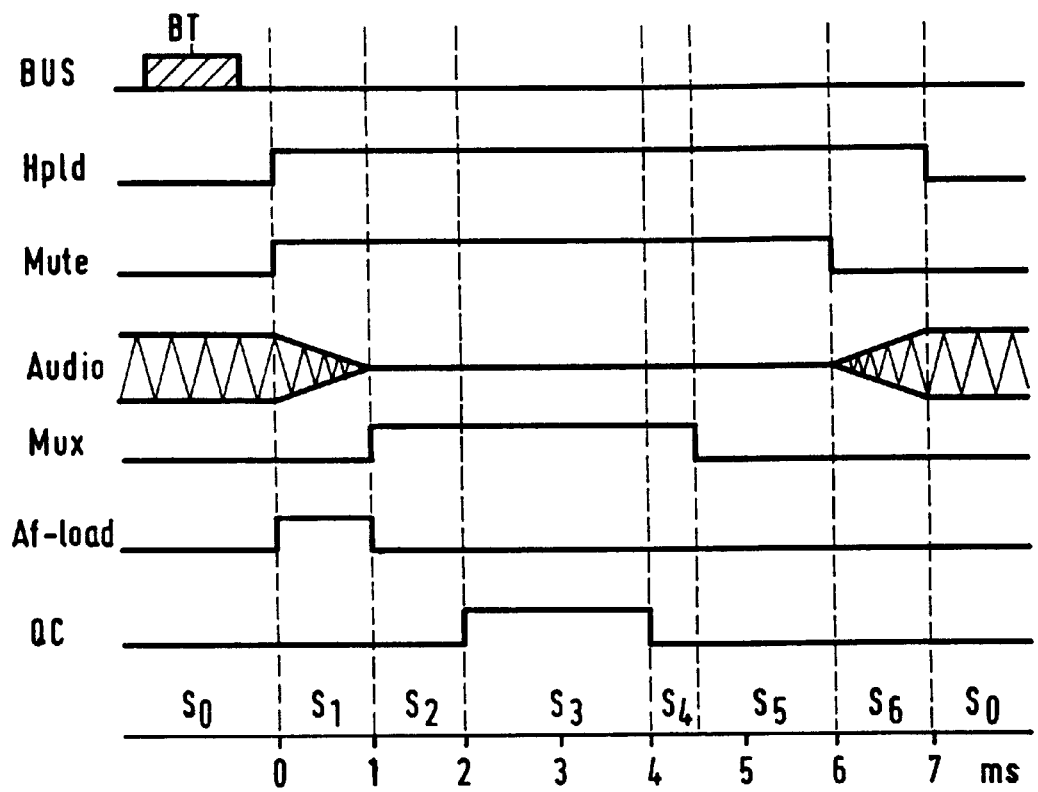
FIG. 2 shows a timing diagram for illustrating the operation of the controller in the receiver, shown in FIG. 1.

The main task of coordinating the alternative frequency updating is carried out by the controller 21, which is preferably a simple hardware sequential controller. The controller 21 receives the Af, Mt and Sc' information to define its internal state conditions. Depending on these internal states, the controller 21 generates a set of output signals to coordinate the tuning system, the quality detector 27, the muting stage 5 and the audio processor 6. The operation of the controller 21 will be explained with reference to the timing diagram of FIG. 2. FIG. 2 shows, from top to bottom, the timing diagrams of the following signals:

a Bus signal comprising an Af-update bus-transmission BT, which is indicated by a hatched block, a Hold signal which is applied to the audio processor 6, a Mute signal which is applied to the muting stage 5, the Audio signal which is applied from the muting stage 5 to the audio processor 6, the Af-load signal which is applied to the Af-register 19, a QC signal which is applied to the quality detector 27.

When the receiver is switched on and tuned to an FM channel, by either preset, manual tuning or search, the value of the Af-bit is set to "0". The register selector 17, which is controlled by this Af-bit, then routes the frequency information to the main frequency register 18 and, via the multiplexer 20 to the programmable frequency divider 15a. After tuning, the RDS information of the main channel, among others, the alternative frequency list, is read by the microcontroller 13 in the conventional way. During this time, the controller 21 is in the rest-state which is indicated in FIG. 2 by S0. The microcontroller then initiates an update operation for the first Af channel on the list by sending a data package including the Af-bit and the alternative frequency information to the bus-latches 16a/16b, then the Mt-bit and the DAA-information to bus latch 22, and, thereafter, the Sc-bit. The Sc-bit is detected by Sc-detector 25 and the output pulse thereof sets, by means of flip-flop 26, the stop condition Sc'=1. This signifies that a new bus communication has taken place and the controller 21 moves from rest-state S0 to state S1 of FIG. 2. From the above, it may be clear that the message, which is communicated by the microcontroller via the serial I²C-bus 14, comprises, in succession: the slave address of the tuning system, the Af-bit, the fifteen bits of the frequency information, the Mt-bit, the seven bits of the DAA-information, and, finally, the Sc bit.

Once in state S1, the controller 21 activates the Hold, Mute and Af-load signals. The Hold signal is applied to the audio processor 6 to hold the weak signal processing conditions, such as, soft mute depth and stereo separation, of the main frequency channel during the frequency jump. The Mute signal is applied to the muting stage 5 to mute the audio signal with a gentle slope of, e.g., 1 ms to avoid sharp audio transitions. The Af-load signal is applied to Af-register 19 for loading the Af-frequency information from the bus-latches 16a/16b, via the register selector 17 into the Af-register 19. The state S1 persist for 1 ms, after which there is an unconditional jump to state S2. Although the Af-load signal is high in state S1, the frequency information is loaded into the PLL only on the trailing edge of this signal, i.e., on the transition from state S1 to state S2. At this time, the multiplexer 20 is set to the Af-register by the Mux=1 signal. The PLL then makes a frequency jump to the alternative frequency channel.

The time required for the frequency jump will vary depending on parameters, such as, the frequency distance and the gain of the voltage-controlled oscillator in front end 1. For simplicity, it is assumed in the practical embodiment of FIGS. 1 and 2, that the frequency jump is always across the entire FM-band, which would result in a tuning time of 1 ms. In practice, the tuning time will always be less. A more complicated, but faster, system may use an in-lock detector, per se known in the art, to indicate that a tuning to a new frequency has been accomplished.

After the required time of 1 ms for tuning to the alternative frequency, there is an unconditional transition from state S2 to state S3. In this state, the frequency of the voltage-controlled oscillator in front end 1 is stable and quality measurements can commence. The controller 21 indicates this by setting the QC-signal, applied to quality detector 27, high in state S3. The controller 21 stays in state S3 for 2 ms before moving into state S4. This time will, of course, always be a compromise between reliability of the quality measurements and inaudibility. 2 ms is adequate for RF level measurements. However, other parameters, such as, IF value and multipath distortion, require longer times. But when allowing only 2 ms for the quality measurement, the now "inaudible" samples can be averaged later on by the microcontroller to achieve a more reliable estimate. Also, if the PLL can be made faster, requiring less time for the frequency jump, the time for quality measurements can be increased. This can be done by a simple change of the parameters of the controller 21.

During the state S4, the analog quality information is converted to digital and loaded into quality latches 28. The duration of state S4 should be long enough to ensure stable output at the latches. In practice, this duration is set to 0.5 ms, but, of course, this duration, as well as the PLL jump delays, can also be software controlled parameters for more flexibility at the cost of higher complexity.

On the transition from state S4 to state S5, the Mux-signal is set to "0" so that the main channel frequency information, which is still present in the Mf-register 18, is loaded in the PLL and the PLL re-tunes the VCO back to the main channel. To ensure complete inaudibility, it is desirable to wait until the PLL is tuned to within 2 kHz of the wanted frequency before de-muting. This is a more stringent requirement than the frequency jump to the alternative frequency for quality measurement. In the practical embodiment described, the controller 22 remains in state S5 for 1.5 ms before de-muting the audio-signal in state S6. However, since in practice the de-muting is not instantaneous, it may not be necessary to wait longer than 1 ms.

The de-muting of the audio signal in state S6 also takes place with the same gentle slope of 1 ms as the muting in state S1. After this, the Hold signal is reset and the sequential controller returns to the rest-state S0. The receiver is than back to the main channel with its original weak signal processing settings and the updating cycle is complete. The total audio muting period is now only 5 ms and therefore inaudible, without much sacrifice on the quality measurements or requiring a very complex ultra high speed tuning system. The alternative frequency quality information is available to the microcontroller (in the quality latches 28) and can be read any time after state S4 via the I²C-bus.

Supplementary to the Af update mode, as above described, the same circuitry with the controller 21 can advantageously be used in other modes, such as, the preset mode. This mode is initiated by the user pressing a preset button, whereupon the microcontroller 13 sends the presetted frequency information and the corresponding DAA-information with Af=0 and Mt=1 to the bus-latches 16a/16b/22. Upon detection of the Sc bit by Sc-detector 25, the controller 21 changes from the rest-state S0 to a first active state wherein the signal Mute=1 for muting the audio signal with gentle slope, Mf-load=1 for loading the received frequency information into Mf-register 18 and DAA-load=1 for loading the DAA-information into DAA-register 23. After 1 ms in the first active state for allowing the audio signal to become muted with the gentle slope, an unconditional transition to a second active state occurs. This transition loads the content of Mf-register 18, through multiplexer 20, into the PLL-divider to tune the PLL to the preset frequency. Furthermore, in this second active state, the QC-signal is made high so as to continuously carry out quality measurements on the newly selected frequency. After a predetermined period, the microcontroller sends a bit Mt=0 to bus latch 22. This causes the sequential controller to make the Mute-signal=0 so as to de-mute the muting stage 5.

Another mode is the automatic search mode. This can be implemented as a repetition of the preset mode (Af=0, Mt=1) each time with an increment of the communicated frequency by, e.g., 100 kHz. This repetition continues until a signal with sufficient quality has been detected. Then the microcontroller de-mutes the muting stage 5 by sending Mt=0 to the bus latch 22.

Figure 3:
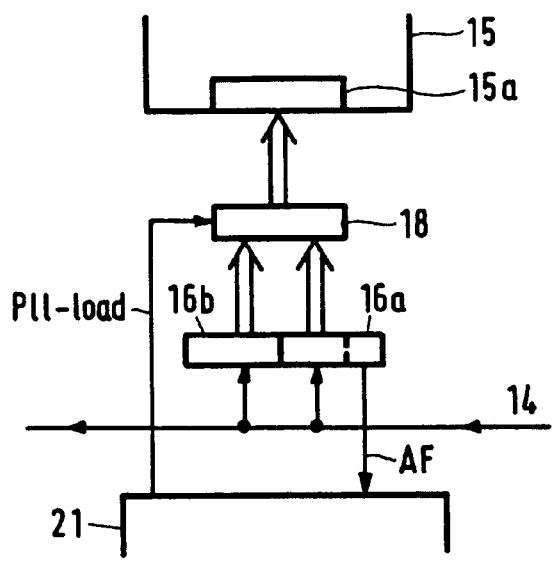
FIG. 3 shows a modification of the block diagram of FIG. 1
Figure 4:
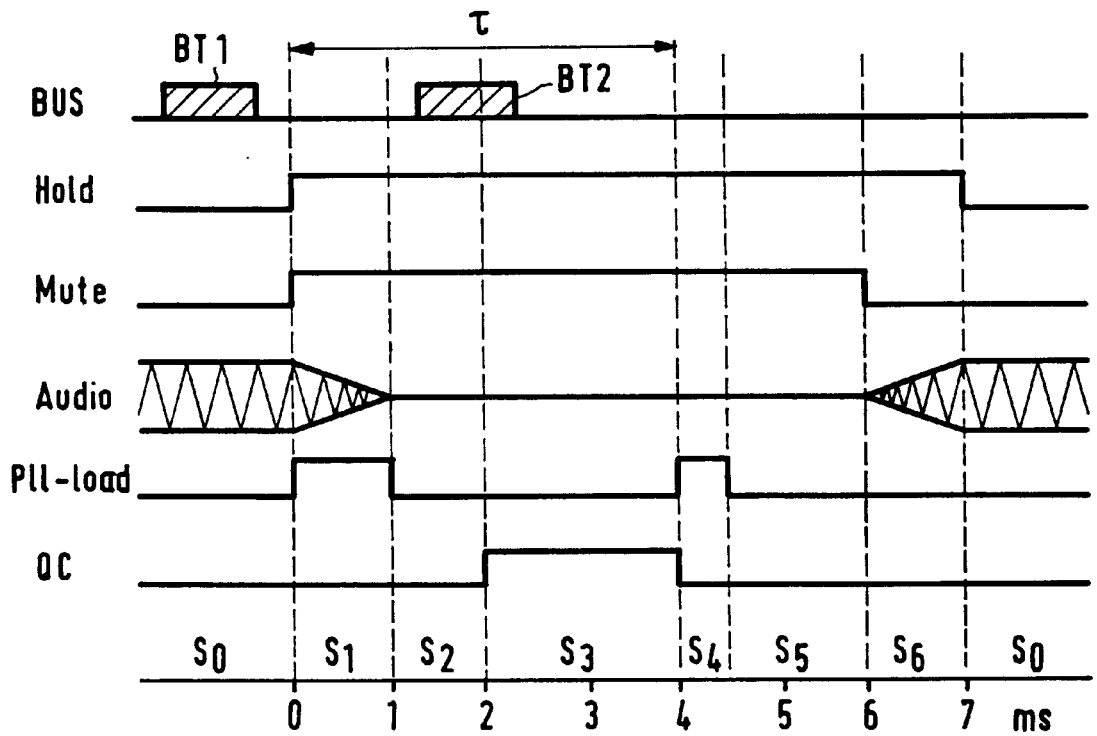
FIG. 4 shows a timing diagram for illustrating the operation of the controller in the modification shown in FIG. 3.

It may be noted that other configurations for the storage means of the two frequency-informations are possible. For instance, when two different bus-latches for the Mf-information and for the Af-information are used, then the selector 17 can be dispensed with. Or with these two different bus-latches and the selector 17, one of the registers 18, 19 and the multiplexer 20 can be omitted. A third modification is shown in FIG. 3 which shows a block diagram of a modification with minimal chip-area requirement. In this block diagram, the register selector 17, the Af-register 19 and the multiplexer 20 of the diagram of FIG. 1 are removed. The register 18 now serves for registering both the main frequency information and the alternative frequency information. FIG. 4 shows the corresponding timing diagram.

The state transitions from S0 to S1, from S1 to S2 and from S2 to S3, are the same as with the algorithm of FIG. 2 again with the bus transmission (BT1) for the alternative frequency information during rest state S0. The difference is that now the main frequency information is lost as soon as the alternative frequency information has been loaded in register 18. This lost main frequency information is now communicated by the microcontroller during a second bus transmission BT2. The main frequency information is sent with Af=1, so that the controller 21 can distinguish between a return jump to the main channel in the updating mode and a preset jump to a new frequency. The PLL-load signal, which replaces the Af-load signal and the Mf-load signal of FIG. 1, is made high, not only during state S1 but also during state S4. At the first trailing edge (S1→S2), the alternative frequency information, received with BT1, is loaded into the PLL, and at the second trailing edge (S4→S5), the main frequency information, received with BT2, is loaded into the PLL. The second bus transmission BT2 should not occur outside the time slot T between the transition from state S0 to state S1 and the transition from state S3 to state S4. This data transmission should not commence before the alternative frequency information has been loaded into the register 18. On the other hand, it should be finished before the state S4 so that the PLL can be loaded correctly.

Preferably the whole tuning section TS, as indicated in FIG. 1 and 2, may be built up with one single monolithic integrated circuit plus periferal passive components, so that a system is obtained with a microcontroller external to said integrated circuit and a further controller internal to the integrated circuit.

What is claimed is:

1. A radio receiver for receiving a main radio broadcast signal having a particular transmission frequency and comprising a data signal containing information on one or more alternative frequencies to which the receiver may be tuned in case the quality of the main radio broadcast signal drops below predetermined standards, said receiver comprising:

a tuning section for selecting, amplifying and demodulating the main radio broadcast signal;

a data signal demodulator for extracting and demodulating the data signal contained therein;

a microcontroller for extracting alternative frequency information of an alternative radio broadcast signal from the demodulated data signal; and a serial communication bus coupled to said microcontroller carrying signals from said microcontroller to said tuning section, and from said tuning section to said microcontroller, wherein said tuning section comprises storage means coupled to the serial communication bus for storing frequency information sent by said microcontroller over said serial communication bus, characterized in that said storage means comprises a first section for storing main frequency information of said main radio broadcast signal sent by said microcontroller over said serial communication bus, and a second section for storing said alternative frequency information also sent by said microcontroller over said serial communication bus, and the tuning section further comprises controlling means for temporarily tuning the tuning section to an alternative radio broadcast signal for establishing the quality of the alternative radio broadcast signal, said controlling means utilizing the alternative frequency information contained in the second section of said storage means to tune the tuning section to the alternative radio broadcast signal, and the frequency information contained in the first section of said storage means to re-tune the tuning section to the main radio broadcast signal, whereby an amount of time that said radio receiver is tuned to said alternative radio broadcast signal is minimized, in that the alternative frequency information and the main frequency information are taken directly from said second and first sections, respectively, of said storage means.

2. A radio receiver as claimed in claim 1, characterized in that said storage means receives the main frequency information of the main radio broadcast signal from the microcontroller through the serial communication bus during the time that the tuning section is temporarily tuned to the alternative radio broadcast signal, said controlling means using the content of said storage means to re-tune the tuning section to the main radio broadcast signal when the temporary tuning to the alternative radio broadcast signal ends.

3. A radio receiver as claimed in claim 1, characterized in that the microcontroller sends the alternative frequency information and the main frequency information of the main radio broadcast signal to the storage means in a plurality of bytes, whereby one of the bits in the plurality of bytes indicates whether the information is alternative frequency information, for storage in the second section of the storage means, or main frequency information of the main radio broadcast signal, for storage in the first section of the storage means.

4. A monolithic integrated circuit for use in a radio receiver as claimed in claim 1, comprising means for connecting said monolithic integrated circuit, through a serial communication bus, to a microcontroller, and comprising said tuning section, said storage means, and said controlling means for controlling the update of alternative frequency transmissions of said radio receiver.

* * * * *